(12) United States Patent
Mahadik et al.

(10) Patent No.: US 11,171,055 B2
(45) Date of Patent: Nov. 9, 2021

(54) UV LASER SLICING OF β-GA$_2$O$_3$ BY MICRO-CRACK GENERATION AND PROPAGATION

(71) Applicant: The Government of the United State of America, as represented by the Secretary of the Navy, Arlington, VA (US)

(72) Inventors: Nadeemullah A. Mahadik, Springfield, VA (US); Robert E. Stahlbush, Silver Spring, MD (US); Marko J. Tadjer, Springfield, VA (US); Karl D. Hobart, Alexandria, VA (US); Francis J. Kub, Arnold, MD (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 141 days.

(21) Appl. No.: 16/776,851

(22) Filed: Jan. 30, 2020

(65) Prior Publication Data
US 2020/0251389 A1    Aug. 6, 2020

Related U.S. Application Data

(60) Provisional application No. 62/799,253, filed on Jan. 31, 2019.

(51) Int. Cl.
*H01L 21/78* (2006.01)
*H01L 21/02* (2006.01)
(Continued)

(52) U.S. Cl.
CPC ............ *H01L 21/78* (2013.01); *B28D 5/0005* (2013.01); *H01L 21/02035* (2013.01); *H01L 21/268* (2013.01); *H01L 22/12* (2013.01)

(58) Field of Classification Search
CPC . H01L 21/78; H01L 21/7813; H01L 21/7806; H01L 21/268; H01L 21/02035;
(Continued)

(56) References Cited

U.S. PATENT DOCUMENTS

| 4,181,627 A * | 1/1980 | Weiher | C09K 11/565 |
|---|---|---|---|
| | | | 252/301.6 R |
| 6,411,636 B1 * | 6/2002 | Ota | H01S 5/0201 |
| | | | 372/43.01 |

(Continued)

OTHER PUBLICATIONS

Varley, J.B. et al., Role of Self-Trapping in Luminescence and p-type Conductivity of Wide-Band-Gap Oxides, Physical Review B, Feb. 27, 2012, pp. 081109-1-081109-4, vol. 85, No. 081109, American Physical Society, College Park, MD, USA.

(Continued)

*Primary Examiner* — Michael M Trinh
(74) *Attorney, Agent, or Firm* — US Naval Research Laboratory; Suresh Koshy

(57) ABSTRACT

A method of cleaving includes providing a substrate. Optionally, the substrate includes β-gallium oxide, hexagonal zinc sulfide, or magnesium selenide. The substrate includes at least one natural cleave plane and a crystallinity. The substrate is cleaved along a first natural cleave plane of the at least one natural cleave plane. The cleaving the substrate along the first natural cleave plane includes the following. A micro-crack is generated in the substrate while maintaining the crystallinity adjacent to the micro-crack by generating a plurality of phonons in the substrate, the micro-crack comprising a micro-crack direction along the first natural cleave plane. The micro-crack is propagated along the first natural cleave plane while maintaining the crystallinity adjacent to the micro-crack. Optionally, generating a micro-crack in the substrate by generating a plurality of phonons in the substrate includes generating the plurality (Continued)

of phonons by electron-hole recombination. Optionally, the electron-hole recombination includes non-radiative electron-hole recombination.

21 Claims, 6 Drawing Sheets

(51) Int. Cl.
*B28D 5/00* (2006.01)
*H01L 21/66* (2006.01)
*H01L 21/268* (2006.01)

(58) Field of Classification Search
CPC ......... H01L 21/02008; H01L 21/02002; H01L 21/0201; B28D 5/0005; B28D 5/0011; H01S 5/0202; B23K 26/53
See application file for complete search history.

(56) References Cited

U.S. PATENT DOCUMENTS

| | | | | |
|---|---|---|---|---|
| 6,420,678 | B1* | 7/2002 | Hoekstra | B23K 26/0604 219/121.75 |
| 6,499,355 | B1* | 12/2002 | Potyrailo | G01B 11/20 73/150 A |
| 8,071,960 | B2* | 12/2011 | Hoeche | G01N 1/286 250/440.11 |
| 8,871,540 | B2* | 10/2014 | Sato | B23K 26/53 438/33 |
| 9,525,150 | B2* | 12/2016 | Jain | H01L 33/0093 |
| 2010/0270548 | A1* | 10/2010 | Ikemoto | H01L 33/0095 257/43 |
| 2010/0314606 | A1* | 12/2010 | Yang | H01L 33/40 257/13 |
| 2015/0209898 | A1* | 7/2015 | Kim | C03B 33/04 65/112 |
| 2016/0336233 | A1* | 11/2016 | Yonehara | B23K 26/082 |
| 2017/0122810 | A1* | 5/2017 | Brunner | G01J 5/025 |
| 2018/0248070 | A1* | 8/2018 | Farah | H01L 31/03046 |

OTHER PUBLICATIONS

Shimamura, Kiyoshi et al., Excitation and Photoluminescence of Pure and Si-doped β-Ga$_2$O$_3$ Single Crystals, Appl. Phys. Lett., May 23, 2008, pp. 201914-1-201914-3, vol. 92, No. 201914, American Institute of Physics, College Park, MD, USA.

* cited by examiner

UV LASER SLICING OF β-GA$_2$O$_3$ BY MICRO-CRACK GENERATION AND PROPAGATION

CROSS-REFERENCE TO RELATED APPLICATIONS

This Application claims the benefit of U.S. Provisional Application Ser. No. 62/799,253 filed on 31 Jan. 2019, the entirety of which is incorporated herein by reference.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing NC 108858-US2.

BACKGROUND OF THE INVENTION

Field of the Invention

This invention relates in general to a method of slicing and/or cleaving a semiconductor substrate, and in particular to a method of slicing and/or cleaving a semiconductor substrate using phonons.

Description of the Related Art

Single crystal Ga$_2$O$_3$ has gathered a lot of attention for the fabrication of power devices, ultraviolet ("UV") detectors and optoelectronic devices due to its very high bandgap of 4.9 eV and the possibility of equilibrium crystal growth such as Czochralski, vertical Bridgman, edge fed film growth, and other methods. Single crystals of up to 100 mm diameter are commercially available and 150 mm diameter crystals have been demonstrated. The single crystal boules grown are of limited thickness and it is desired to obtain as many wafers as possible from a single boule. Additionally, it is also desired to cleave the sliced wafers into large defect free regions for optoelectronic devices and other applications.

A conventional method of slicing boules involves using a wire saw or a wafer-dicing saw to slice boules into wafers. However, slicing with a wire saw or a wafer-dicing saw causes a large kerf (i.e., cut) width in excess of 150 μm and generates surface damage, creating the need for polishing by several chemical-mechanical polishing steps. Such polishing steps necessarily eliminates substrate material, thereby wasting the substrate material.

Another conventional method of slicing boules involves using lasers for wafer dicing. Such conventional wafer dicing using lasers does not exploit the crystallographic direction, orientation, or planes of the wafer. The laser intensity at the focal point of the laser is on the order of 100s of kW/cm$^2$. Such conventional wafer dicing using lasers employs two-photon absorption ("TPA"), thereby generating phonons to create a mechanical damage in the wafer. The kerf width caused by the mechanical damage is about 200-300 μm, requiring grinding and polishing steps and hence wasted substrate material. An example of such conventional wafer-dicing using lasers is Hamamoto Photonics' Stealth Dicing™ Process. The Stealth Dicing™ Process includes inducing grids of mechanical damage inside a wafer crystal using sub-bandgap focused lasers bursts and then stretching the wafer to mechanically break off individually diced coupons.

BRIEF SUMMARY OF THE INVENTION

An embodiment of the invention includes a method of cleaving boules or wafers. The method includes providing a substrate. Optionally, the substrate includes β-gallium oxide, hexagonal zinc sulfide, or magnesium selenide. The substrate includes at least one natural cleave plane and a crystallinity. The substrate is cleaved along a first natural cleave plane of the at least one natural cleave plane. The cleaving the substrate along the first natural cleave plane includes the following. A micro-crack is generated in the substrate while maintaining the crystallinity adjacent to the micro-crack by generating a plurality of phonons in the substrate, the micro-crack comprising a micro-crack direction along the first natural cleave plane. The micro-crack is propagated along the first natural cleave plane while maintaining the crystallinity adjacent to the micro-crack. Optionally, generating a micro-crack in the substrate by generating a plurality of phonons in the substrate includes generating the plurality of phonons by electron-hole recombination. Optionally, the electron-hole recombination includes non-radiative electron-hole recombination.

An embodiment of the invention includes a method to slice and cleave a semiconductor substrate, such as β-Ga$_2$O$_3$ material using an ultrafast UV laser. This method creates minimal damage to the material as compared with typical wire saw used for slicing and cleaving the β-Ga$_2$O$_3$ material. Advantageously, use of this embodiment of the invention yields slices with a 10× smaller kerf width compared to the traditional wire saw slicing method. For example, in an embodiment of the invention, the created kerf width is less than ten microns. For example, in another embodiment of the invention, the created kerf width is less than five microns. Advantageously, use of this embodiment of the invention yields slices of Ga$_2$O$_3$ single crystal material with a smaller kerf width, so that more wafers can be obtained from the same thickness of the crystal boule as compared to conventional slicing methods.

An embodiment of the invention includes a method to induce plane splitting via localized thermal expansion of the β-Ga$_2$O$_3$. Such localized thermal expansion creates low damage natural cleave planes by exploiting one or more of the following properties of β-Ga$_2$O$_3$: 1) primary (100) plane and secondary (001) plane as natural cleave planes; 2) very low thermal conductivity (e.g., 10-30 W/mK); and self-trapped hole non-radiative recombination capable of being excited by a 355 nm laser. This method embodiment employs single photon absorption, not TPA. Because the TPA absorption coefficient β is 10$^2$-10$^5$ times less than the single photon absorption coefficient α, the TPA laser power density at the laser's focused spot must be much higher than that of the instant method and therefore necessarily creates more mechanical damage to the substrate.

Advantageously, an embodiment of this invention generates a minimal damage region, which permits a much simplified polishing requirement relative to conventional slicing methods. For example, an embodiment of this inventive method was not observed to create extended defects upon the cutting of the crystal. For example, using an ultrafast 355 nm laser, the method does not generate defects from damage. The Ga$_2$O$_3$ crystal has a much higher band gap of 4.9 eV, but it has been shown that there is an absorption of photons in the material with wavelength of 300-420 nm due to recombination of free electrons and self-trapped holes due to large lattice distortions of the oxygen atoms. This recombination is broader than band-edge transitions as expected and shows a large electron-phonon coupling. Hence by using a laser excitation wavelength of 355 nm, it is possible to excite this transition and cause the recombination centered at ~390 nm, thereby also creating phonons, which causes heating and the micro-crack to occur.

An embodiment of the invention is anticipated to facilitate the commercialization of semiconductor substrates such as beta-gallium oxide ($\beta$-$Ga_2O_3$), zinc sulfide (ZnS) and magnesium selenide (MgSe) and/or wafer orientations thereof. For example, $\beta$-$Ga_2O_3$ with a (100) wafer orientation is used for metal organic chemical vapor deposition growth. For example, epitaxial $\beta$-$Ga_2O_3$ is used for high voltage, high power, high efficiency, improved size, weight, and power ("SWaP") Smart Power and pulsed power applications, unmanned aerial vehicles, unmanned undersea vehicles, space vehicles, and/or radar power supplies. Although bulk single crystal $Ga_2O_3$ is commercially available, use of the instant method will increase wafer yield, thereby making use of the substrate more attractive and cost effective in applications such as high voltage power devices, ultraviolet ("UV") detectors, and/or optoelectronic devices.

DETAILED DESCRIPTION OF THE INVENTION

An embodiment of the invention includes a method and is described as follows. A standard substrate is provided, such as shown in Step S100 of FIG. 1. The substrate includes at least one natural cleave plane and a crystallinity. For the purpose of this patent application, "basal plane" is a term of art and means any crystal plane in a semiconductor substrate (i.e., a wafer orientation of the semiconductor substrate) that has the closest or next closest atomic packing density. For the purpose of this patent application, "natural cleave plane" is a term of art and means one of a low energy basal plane in a semiconductor substrate along which atomic cleavage can occur. For the purpose of this patent application, "basal plane" and "natural cleave plane" are not synonymous. For the purpose of this patent application, "crystallinity" is a term of art and means regularly spaced planes of atoms in the substrate. The substrate is cleaved along a first natural cleave plane of the at least one natural cleave plane, such as shown in Step S200 of FIGS. 1 and 2. The cleaving the substrate along the first natural cleave plane includes the following. A micro-crack is generated in the substrate at a natural cleave plane, thereby maintaining crystalline ordering adjacent to the micro-crack by generating a plurality of phonons in the substrate, such as shown in Step S210 of FIGS. 2 and 3. The micro-crack includes, or has, a micro-crack direction along the first natural cleave plane. The micro-crack is propagated along the first natural cleave plane while maintaining the crystallinity adjacent to the micro-crack, such as shown in Step S220 of FIGS. 2, 5, and 6. For example, in another embodiment of the invention, this cleaving step generates a kerf width in the substrate of less than 10 microns. For example, in another embodiment of the invention, this cleaving step generates a kerf width in the substrate of less than 5 microns.

Optionally, the substrate comprises a defect disrupting the first natural cleave plane. Optionally, the generating a micro-crack in the substrate by generating a plurality of phonons in the substrate includes generating the plurality of phonons by electron-hole recombination, such as shown in Step S214 of FIG. 3. Optionally, the electron-hole recombination comprises non-radiative electron-hole recombination. Optionally, the non-radiative electron-hole recombination comprises recombination of free electrons and self-trapped holes by absorption of ultraviolet light.

Figure 3:
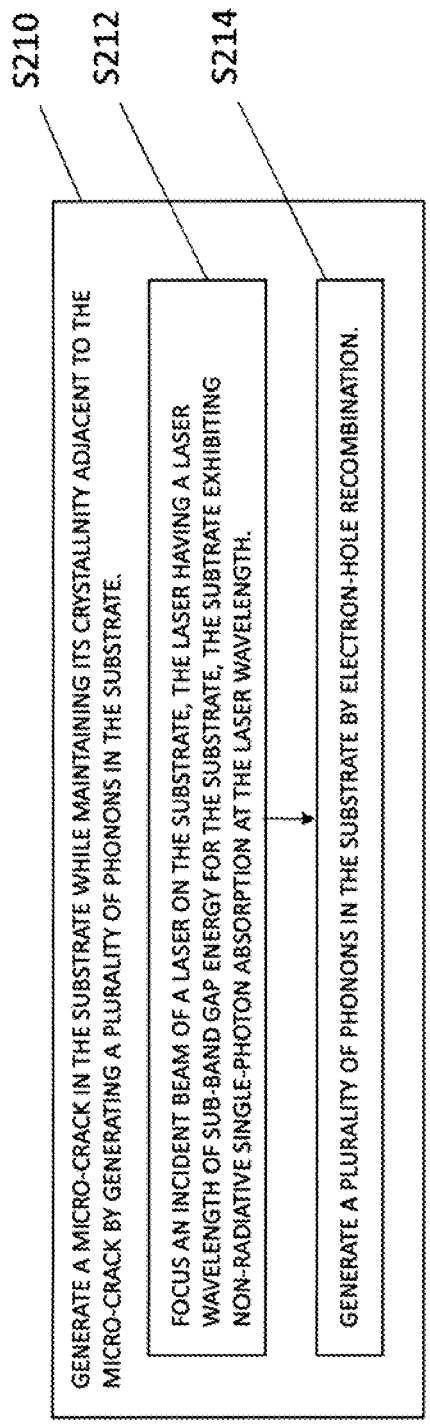
FIG. 3 is an illustrative flow chart of generating a micro-crack according to an embodiment of the invention.

Optionally, the first natural cleave plane includes interplanar lattice spacing greater than 10 angstroms. Also, the substrate comprises more ionic bonding than covalent bonding. Optionally, the substrate comprises a thermal conductivity less than 200 Watts per meter-Kelvin. Optionally, the generating a micro-crack in the substrate by generating a plurality of phonons in the substrate includes the following, such as shown in FIG. 3. An incident beam of a standard laser is focused on the substrate, such as shown in Step S212 of FIG. 3. The laser includes a laser wavelength of sub-band gap energy for the substrate. The substrate exhibits non-radiative single-photon absorption at the laser wavelength. Optionally, the laser includes an average power density on an order of magnitude of hundreds of Watts per $cm^2$. Also, the laser includes a standard continuous wave laser or a standard quasi-continuous wave laser. Optionally, the substrate is $\beta$-$Ga_2O_3$, and the thermal conductivity is between 10 and 30 Watts per meter-Kelvin. Optionally, the substrate is $\beta$-$Ga_2O_3$, and the continuous wave laser includes a standard ultraviolet band, continuous wave or the quasi-continuous wave laser includes a standard ultraviolet band, quasi-continuous wave laser. Optionally, the ultraviolet band, quasi-continuous wave laser is a standard 120 MHz Nd:YAG laser, the laser wavelength is 355 nm, and the average power density is greater than 100 Watts per $cm^2$, and no more than 300 Watts per $cm^2$.

Figure 2:
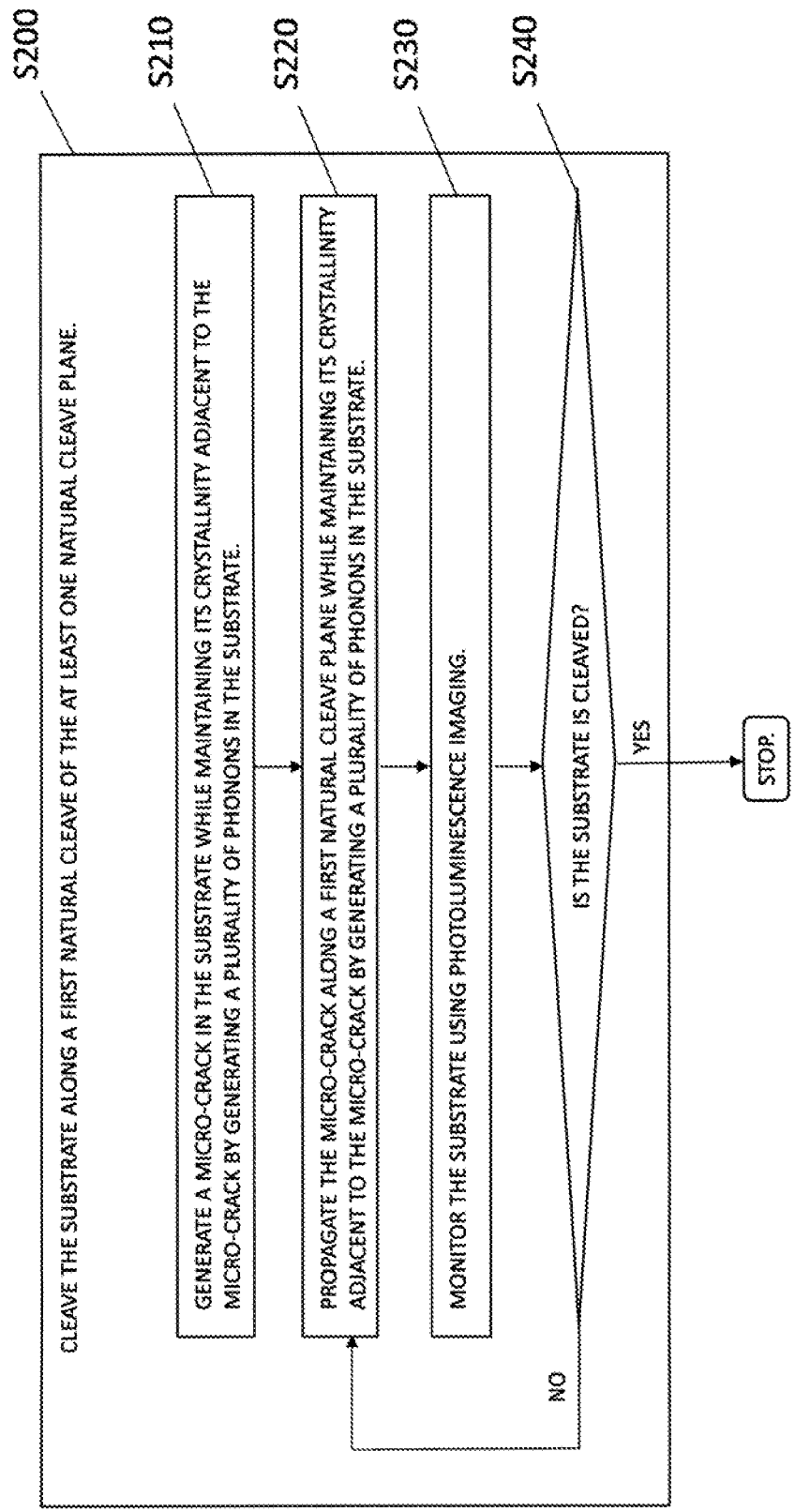
FIG. 2 is an illustrative flow chart of cleaving a substrate according to an embodiment of the invention.
Figure 4:
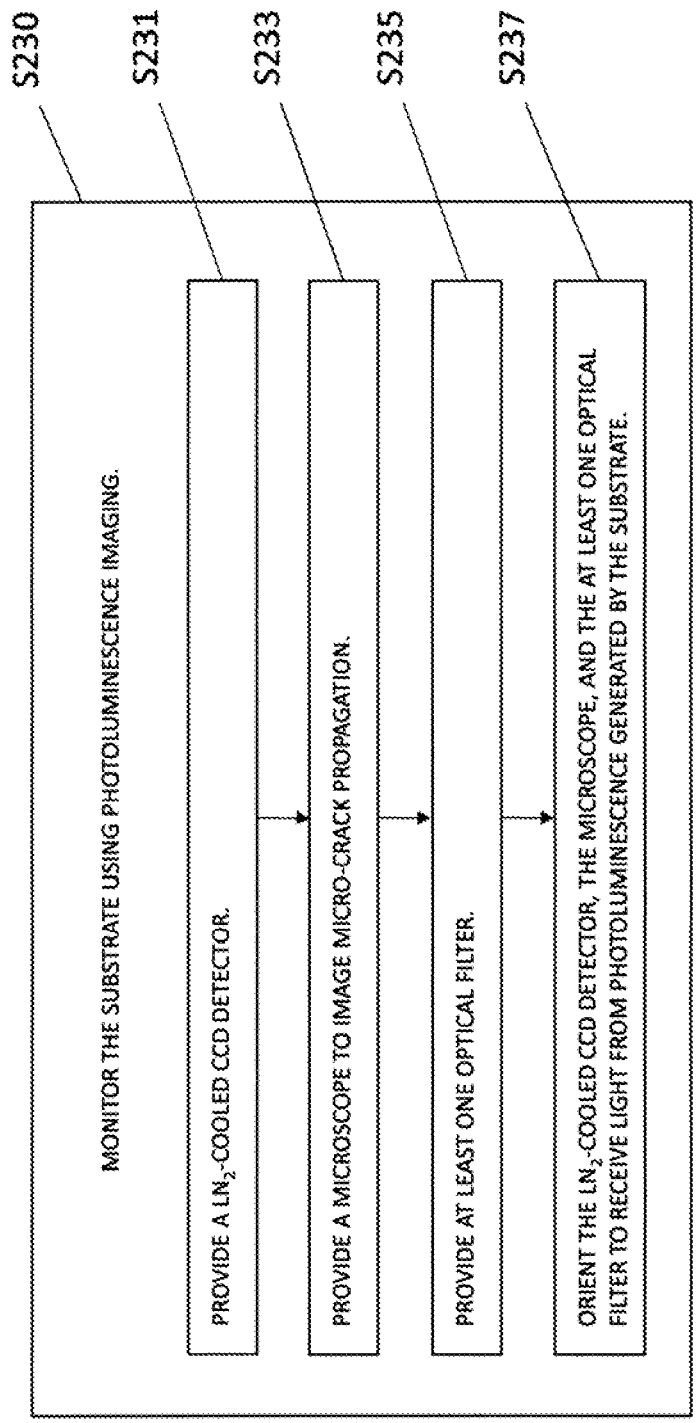
FIG. 4 is an illustrative flow chart of monitoring a substrate according to an embodiment of the invention.

Optionally, the method further includes monitoring the substrate using photoluminescence imaging, such as shown in Step S230 in FIGS. 2 and 4. Optionally, the monitoring the substrate using photoluminescence imaging includes the following. A standard $LN_2$-cooled charge-coupled device ("CCD") detector is provided, such as shown in Step S231 in FIG. 4. A standard microscope is provided to image micro-crack propagation, such as shown in Step S233 in FIG. 4. For example, the microscope includes a standard microscope having a 20× magnification. At least one standard optical filter is provided, such as shown in Step S235 in FIG. 4. The $LN_2$-cooled CCD detector, the microscope, and the at least one optical filter are oriented to receive light from photoluminescence generated by the substrate, such as shown in Step S237 in FIG. 4. For example, after propagating the micro-crack, such as shown in Step S220 of FIG. 2, the substrate is monitored, such as shown in Step S230 of FIG. 2, and then it is determined whether the substrate has been cleaved, such as shown in Step S240 of FIG. 2. If the substrate has not been sufficiently cleaved, then the method loops back to propagating the micro-crack, such as shown in Step S220 of FIG. 2

Optionally, the at least one natural cleave plane comprises at least one of a (100) natural cleave plane, a (001) natural cleave plane.

Figure 1:
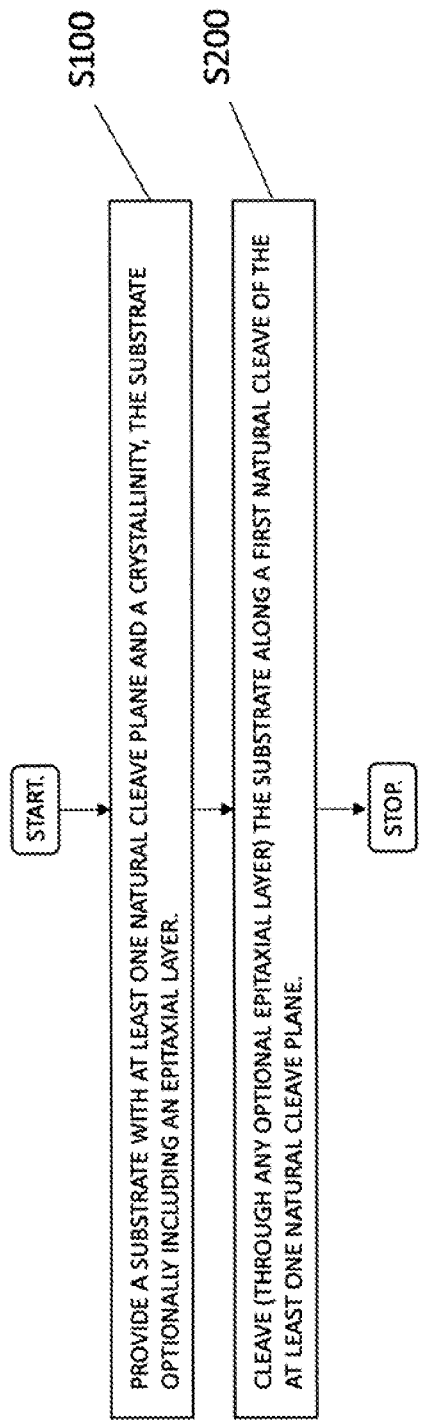
FIG. 1 is an illustrative flow chart of a method according to an embodiment of the invention.

Optionally, the method further includes providing a standard epitaxial layer on top of the substrate, such as shown in Step S100 in FIG. 1. Optionally, the cleaving the substrate along a first natural cleave plane of the at least one natural cleave plane includes cleaving through the epitaxial layer, such as shown in Step S200 in FIG. 1.

Optionally, the substrate includes standard β-gallium oxide, standard hexagonal zinc sulfide, or standard magnesium selenide.

Figure 5:
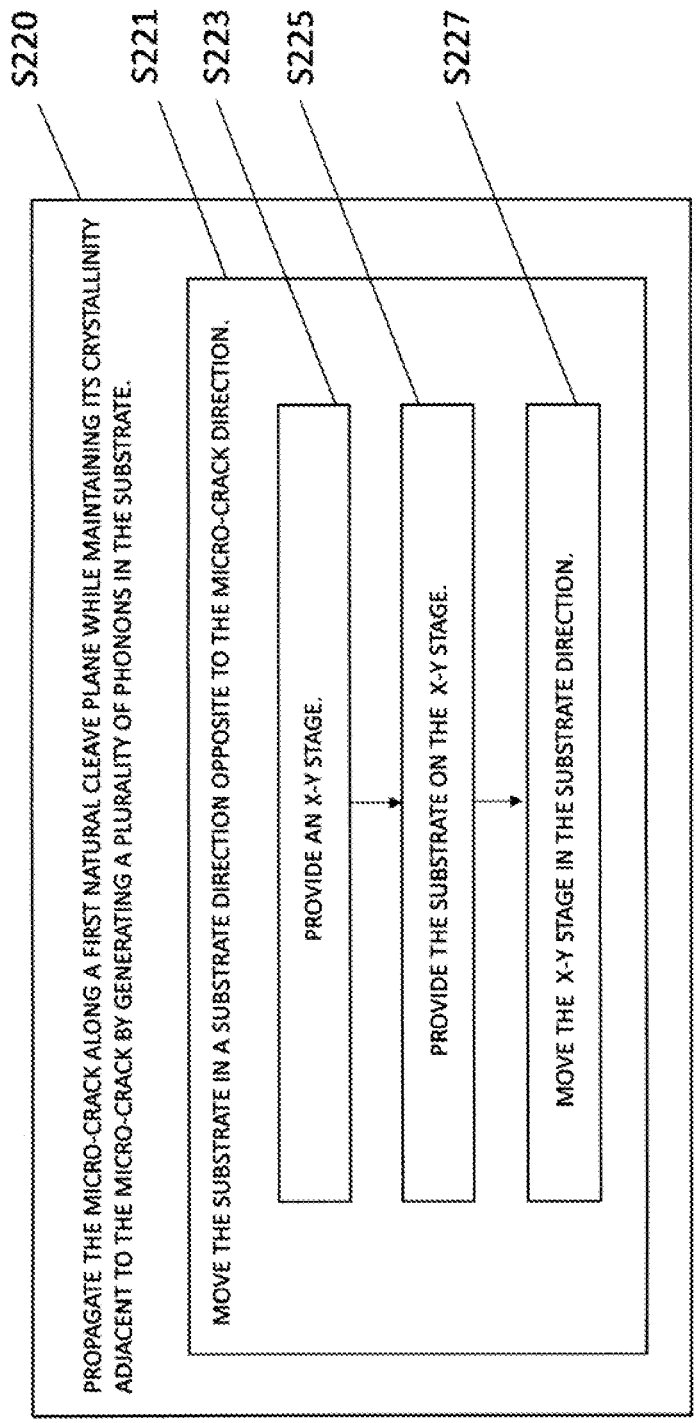
FIG. 5 is an illustrative flow chart of propagating a micro-crack according to an embodiment of the invention.

Optionally, propagating the micro-crack along the first natural cleave plane while maintaining the crystallinity adjacent to the micro-crack includes moving the substrate in a substrate direction opposite to the micro-crack direction, such as shown in Step S221 of FIG. 5. Optionally, the moving the substrate in a substrate direction opposite to the micro-crack direction includes the following. A standard X-Y stage is provided, such as shown in Step S223 of FIG. 5. The substrate is provided on the X-Y stage, such as shown in Step S225 of FIG. 5. The X-Y stage is moved in the substrate direction, such as shown in Step S227 of FIG. 5.

Figure 6:
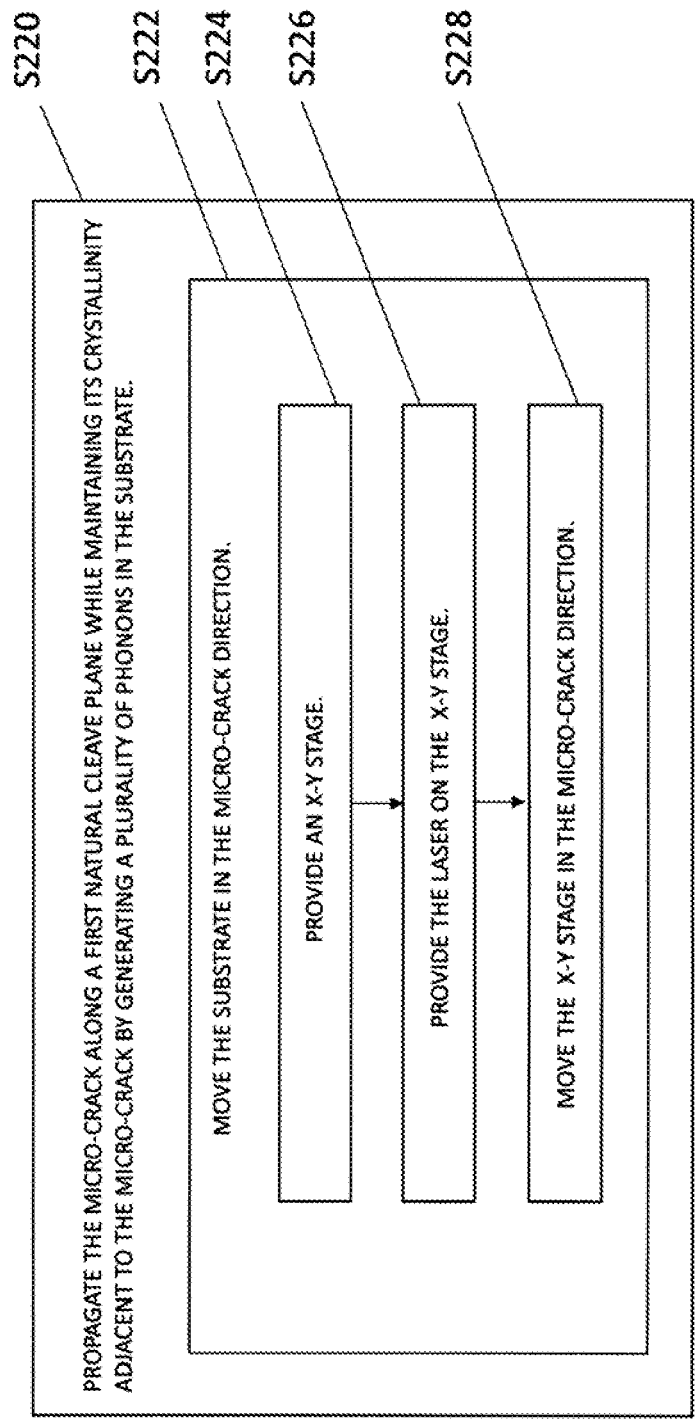
FIG. 6 is another illustrative flow chart of propagating a micro-crack according to an embodiment of the invention.

Optionally, propagating the micro-crack along the first natural cleave plane while maintaining the crystallinity adjacent to the micro-crack includes moving the laser in the micro-crack direction, such as shown in Step S222 of FIG. 6. Optionally, the moving the laser in the micro-crack direction includes the following. A standard X-Y stage is provided, such as shown in Step S224 of FIG. 6. The laser is provided on the X-Y stage, such as shown in Step S226 of FIG. 6. The X-Y stage is moved in the micro-crack direction, such as shown in Step S228 of FIG. 6.

Another embodiment of the inventive method is described as follows. A micro-crack is created in the $Ga_2O_3$ single crystal material in the (010) direction upon UV laser excitation at power densities in excess of 100 W/cm². This micro-crack is then propagated through the entire crystal also by using the same laser causing the slicing or cleaving to occur. The laser is focused to the desired region of the $Ga_2O_3$ crystal using optical components for the generation of the micro-crack. The crystal is then moved through the laser beam using an XY stage in the direction of the crack to cause the crack propagation until the desired slice of the $Ga_2O_3$ crystal is made. The laser used in this method is a frequency tripled Nd:YAG laser with a wavelength of 355 nm, a repetition rate of 120 MHz, with 15 ps pulse width, and a variable power output up to 4 W using a variable beam attenuator. The entire process is monitored, for example, by observing the photoluminescence ("PL") image in-situ with a liquid nitrogen cooled CCD camera with a 665 nm long pass filter. The micro-crack is generated when the laser power density exceeds 100 W/cm². This creates the required local heating that then forms the micro-crack and propagates. The crack is generated in the (010) direction and also propagates in that direction. The <010> direction is one of the natural planes in the material. The micro-crack created by the ultra-fast laser is under 10 μm wide, which is significantly less than the kerf width of a typical wire saw, which can be greater than 150 μm wide.

To perform the slicing or cleaving process, the substrate sample, for example, is placed in a focused laser beam with the laser beam having a wavelength near the UV band of 300-400 nm. The laser is either continuous wave or have an ultrafast repetition rate above 70 MHz. Standard optical components such as standard lenses, standard mirrors, standard beam shaping optics are arranged in a standard manner to ensure the laser beam is incident on the $Ga_2O_3$ material at a local region in order to confine the heating to the desired location. Upon laser excitation at power densities greater than 100 W/cm² a micro-crack is generated. The sample is then moved in the direction of the micro-crack to propagate it, until the slice or cleave is obtained.

Although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

As used herein, the singular forms "a", "an," and "the" do not preclude plural referents, unless the content clearly dictates otherwise.

As used herein, the term "and/or" includes any and all combinations of one or more of the associated listed items.

As used herein, the term "about" when used in conjunction with a stated numerical value or range denotes somewhat more or somewhat less than the stated value or range, to within a range of ±10% of that stated.

All documents mentioned herein are hereby incorporated by reference for the purpose of disclosing and describing the particular materials and methodologies for which the document was cited.

Although the present invention has been described in connection with preferred embodiments thereof, it will be appreciated by those skilled in the art that additions, deletions, modifications, and substitutions not specifically described may be made without departing from the spirit and scope of the invention. Terminology used herein should not be construed as being "means-plus-function" language unless the term "means" is expressly used in association therewith.

This written description sets forth the best mode of the invention and provides examples to describe the invention and to enable a person of ordinary skill in the art to make and use the invention. This written description does not limit the invention to the precise terms set forth. Thus, while the invention has been described in detail with reference to the examples set forth above, those of ordinary skill in the art may effect alterations, modifications and variations to the examples without departing from the scope of the invention.

These and other implementations are within the scope of the following claims.

What is claimed as new and desired to be protected by Letters Patent of the United States is:

1. A method comprising:
   providing a substrate, the substrate comprising at least one natural cleave plane and a crystallinity; and
   cleaving the substrate along a first natural cleave plane of the at least one natural cleave plane, said cleaving the substrate along the first natural cleave plane comprising:
      generating a micro-crack in the substrate while maintaining the crystallinity adjacent to the micro-crack by generating a plurality of phonons in the substrate, the micro-crack comprising a micro-crack direction along the first natural cleave plane;

propagating the micro-crack along the first natural cleave plane while maintaining the crystallinity adjacent to the micro-crack,
wherein the first natural cleave plane comprises interplanar lattice spacing greater than 10 angstroms,
wherein the substrate comprises more ionic bonding than covalent bonding.

2. The method according to claim 1, wherein the substrate comprises a defect disrupting the first natural cleave plane.

3. The method according to claim 1, wherein said generating a micro-crack in the substrate by generating a plurality of phonons in the substrate comprises generating the plurality of phonons by electron-hole recombination.

4. The method according to claim 3, wherein the electron-hole recombination comprises non-radiative electron-hole recombination.

5. The method according to claim 4, wherein the non-radiative electron-hole recombination comprises recombination of free electrons and self trapped holes by absorption of ultraviolet light.

6. The method according to claim 1, wherein the substrate comprises a thermal conductivity less than 200 Watts per meter-Kelvin.

7. The method according to claim 6, wherein said generating a micro-crack in the substrate by generating a plurality of phonons in the substrate comprises:
focusing an incident beam of a laser on the substrate, the laser comprising a laser wavelength of sub-band gap energy for the substrate, the substrate exhibiting non-radiative single-photon absorption at the laser wavelength.

8. The method according to claim 7, wherein the laser comprises an average power density on an order of magnitude of hundreds of Watts per cm$^2$,
wherein the laser comprises one of a continuous wave laser and a quasi-continuous wave laser.

9. The method according to claim 8, wherein the substrate is β-Ga$_2$O$_3$,
wherein the thermal conductivity is between 10 and 30 Watts per meter-Kelvin.

10. The method according to claim 8, wherein the substrate is β-Ga$_2$O$_3$,
wherein the continuous wave laser comprises an ultraviolet band, continuous wave laser,
wherein the quasi-continuous wave laser comprises an ultraviolet band, quasi-continuous wave laser.

11. The method according to claim 10, wherein the ultraviolet band, quasi-continuous wave laser is a 120 MHz Nd:YAG laser,
wherein the laser wavelength is 355 nm,
wherein the average power density is greater than 100 Watts per cm$^2$.

12. The method according to claim 1, further comprising:
monitoring the substrate using photoluminescence imaging.

13. The method according to claim 12, wherein said monitoring the substrate using photoluminescence imaging comprises:
providing a LN$_2$-cooled CCD detector;
providing a microscope to image micro-crack propagation;
providing at least one optical filter; and
orienting the LN$_2$-cooled CCD detector, the microscope, and the at least one optical filter to receive light from photoluminescence generated by the substrate.

14. The method according to claim 1, wherein the at least one natural cleave plane comprises at least one of a (100) natural cleave plane, a (001) natural cleave plane, a (100) natural cleave plane, a (010) natural cleave plane, and a (112) natural cleave plane.

15. The method according to claim 1, further comprising:
providing an epitaxial layer on top of the substrate.

16. The method according to claim 15, wherein cleaving the substrate along a first natural cleave plane of the at least one natural cleave plane comprises:
cleaving through the epitaxial layer.

17. The method according to claim 1, wherein the substrate comprises one of β-gallium oxide, hexagonal zinc sulfide, and magnesium selenide.

18. The method according to claim 1, wherein said propagating the micro-crack along the first natural cleave plane while maintaining the crystallinity adjacent to the micro-crack comprises:
moving the substrate in a substrate direction opposite to the micro-crack direction.

19. The method according to claim 18, wherein said moving the substrate in a substrate direction opposite to the micro-crack direction comprises:
providing an X-Y stage;
providing the substrate on the X-Y stage; and
moving the X-Y stage in the substrate direction.

20. The method according to claim 19, wherein said propagating the micro-crack along the first natural cleave plane while maintaining the crystallinity adjacent to the micro-crack comprises: moving the laser in the micro-crack direction.

21. The method according to claim 20, wherein said moving the laser in the micro-crack direction comprises:
providing an X-Y stage;
providing the laser on the X-Y stage; and
moving the X-Y stage in the micro-crack direction.

* * * * *